United States Patent
Lin et al.

(10) Patent No.: US 9,041,125 B2
(45) Date of Patent: May 26, 2015

(54) FIN SHAPE FOR FIN FIELD-EFFECT TRANSISTORS AND METHOD OF FORMING

(71) Applicant: Taiwan Semiconductor Manufacturing Company, Ltd., Hsin-Chu (TW)

(72) Inventors: Jr-Jung Lin, Hsin-Chu (TW);
Chih-Han Lin, Hsin-Chu (TW);
Ming-Ching Chang, Hsin-Chu (TW);
Chao-Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 49 days.

(21) Appl. No.: 13/866,849

(22) Filed: Apr. 19, 2013

(65) Prior Publication Data

US 2014/0252486 A1   Sep. 11, 2014

Related U.S. Application Data

(60) Provisional application No. 61/788,345, filed on Mar. 15, 2013, provisional application No. 61/776,515, filed on Mar. 11, 2013.

(51) Int. Cl.
| | | |
|---|---|---|
| H01L 21/336 | (2006.01) | |
| H01L 29/66 | (2006.01) | |
| H01L 29/78 | (2006.01) | |
| H01L 21/8234 | (2006.01) | |
| H01L 21/84 | (2006.01) | |
| H01L 27/12 | (2006.01) | |
| H01L 29/417 | (2006.01) | |

(52) U.S. Cl.
CPC ....... *H01L 29/66795* (2013.01); *H01L 27/1211* (2013.01); *H01L 29/41791* (2013.01); *H01L 29/7855* (2013.01); *H01L 21/823431* (2013.01); *H01L 21/845* (2013.01)

(58) Field of Classification Search
CPC ............... H01L 21/823437; H01L 27/1211; H01L 29/41791; H01L 29/66795; H01L 29/7856
USPC .......................................... 257/401, E21.621
See application file for complete search history.

(56) References Cited

U.S. PATENT DOCUMENTS

| | | | |
|---|---|---|---|
| 5,293,056 A | 3/1994 | Terashima | |
| 6,864,163 B1 | 3/2005 | Yu et al. | |
| 7,605,449 B2 * | 10/2009 | Liu et al. | 257/622 |
| 7,719,043 B2 * | 5/2010 | Yamagami et al. | 257/308 |
| 7,749,917 B1 * | 7/2010 | Rana et al. | 438/765 |
| 2004/0188726 A1 | 9/2004 | Iriyama et al. | |
| 2005/0101134 A1 | 5/2005 | Brask et al. | |
| 2006/0138553 A1 | 6/2006 | Brask et al. | |
| 2007/0241414 A1 | 10/2007 | Narihiro | |
| 2008/0296667 A1 | 12/2008 | Mikasa | |
| 2009/0057769 A1 | 3/2009 | Wei et al. | |
| 2009/0134454 A1 | 5/2009 | Takeuchi et al. | |
| 2010/0203717 A1 | 8/2010 | Kanakasabapathy et al. | |
| 2012/0007184 A1 | 1/2012 | Lee | |
| 2012/0292715 A1 | 11/2012 | Hong et al. | |

* cited by examiner

*Primary Examiner* — John C Ingham
(74) *Attorney, Agent, or Firm* — Slater & Matsil, LLP

(57) ABSTRACT

A fin field-effect transistor (finFET) and a method of forming are provided. A gate electrode is formed over one or more fins. Notches are formed in the ends of the gate electrode along a base of the gate electrode. Optionally, an underlying dielectric layer, such as a shallow trench isolation, may be recessed under the notch, thereby reducing gap fill issues.

20 Claims, 9 Drawing Sheets

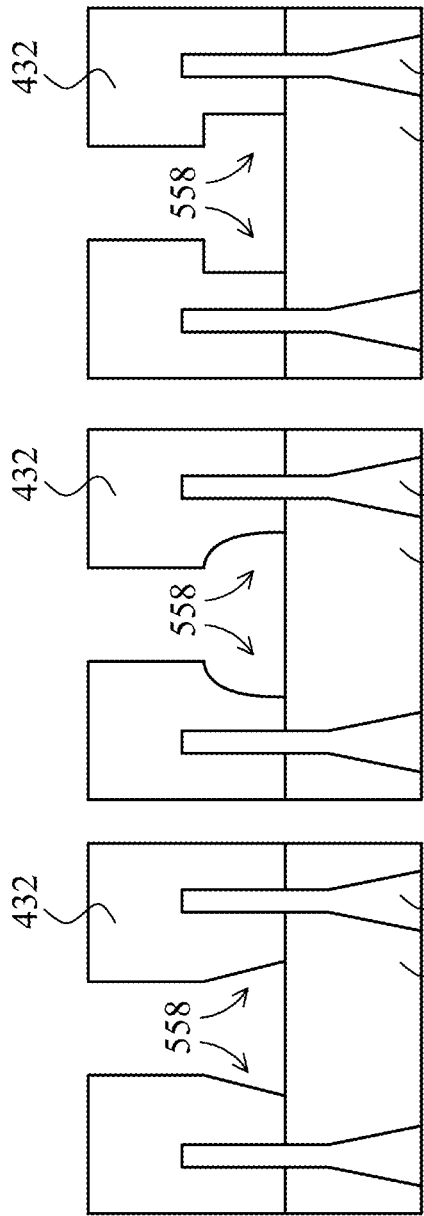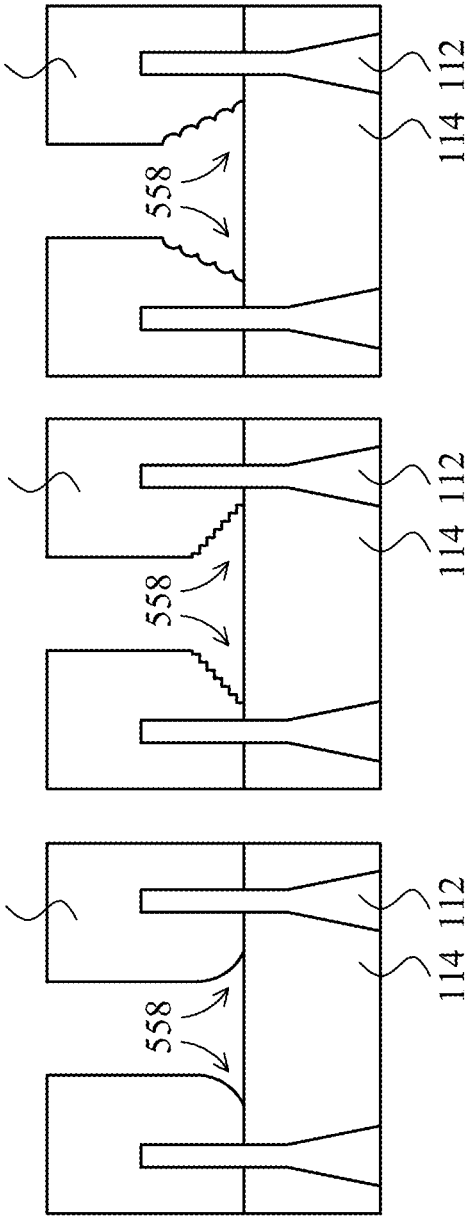

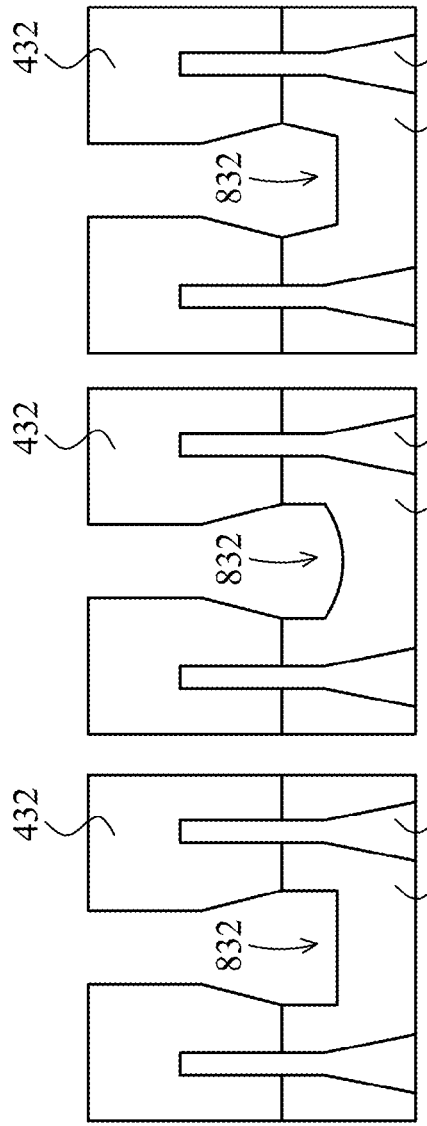
Fig. 8A
Fig. 8B
Fig. 8C
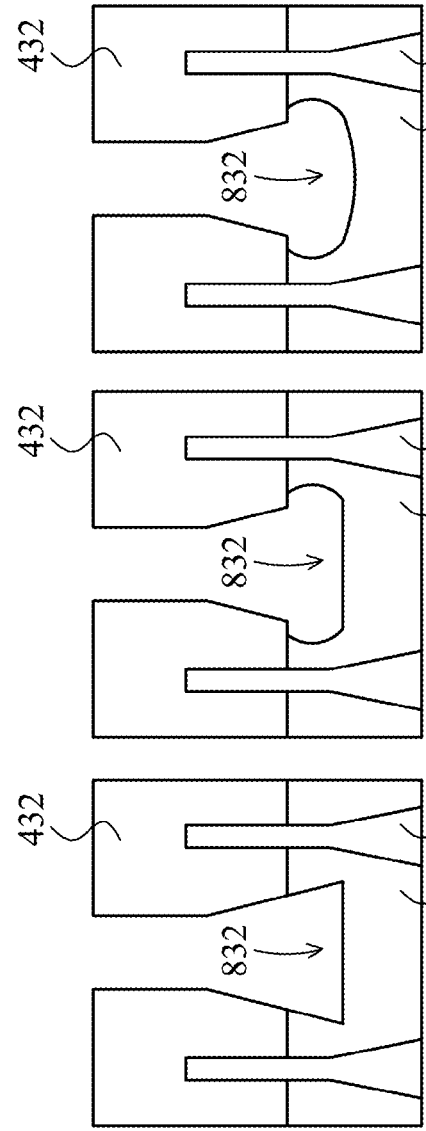
Fig. 8D
Fig. 8E
Fig. 8F

FIN SHAPE FOR FIN FIELD-EFFECT TRANSISTORS AND METHOD OF FORMING

This application is a non-provisional and claims the benefit of U.S. Patent Application Ser. No. 61/776,515, filed on Mar. 11, 2013, entitled "Fin Shape For Fine Field-Effect Transistors And Method Of Forming," and U.S. Patent Application Ser. No. 61/788,345, filed on Mar. 15, 2013, entitled "Fin Shape For Fine Field-Effect Transistors And Method Of Forming," which applications are hereby incorporated herein by reference in their entirety.

BACKGROUND

The dominant semiconductor technology used for the manufacture of ultra-large scale integrated (ULSI) circuits is the metal-oxide-semiconductor field effect transistor (MOSFET) technology. Reduction in the size of MOSFETs has provided continued improvement in speed, performance, circuit density, and cost per unit function over the past few decades. As the gate length of the conventional bulk MOSFET is reduced, the source and drain increasingly interact with the channel and gain influence on the channel potential. Consequently, a transistor with a short gate length suffers from problems related to the inability of the gate to substantially control the on and off states of the channel.

Phenomena such as reduced gate control associated with transistors with short channel lengths are termed short-channel effects. Increased body doping concentration, reduced gate oxide thickness, and ultra-shallow source/drain junctions are ways to suppress short-channel effects. However, for device scaling well into the sub-30 nm regime, approaches involving the use of fin field-effect transistors (finFETs) are being investigated to improve the short channel effects.

Generally, finFETs comprise raised source/drain regions having one or more raised channel regions, referred to as a fin. A gate dielectric and a gate electrode are formed over the fin. It has been found that finFETs provide for improved scalability as design requirements shrink and better short-channel control.

BRIEF DESCRIPTION OF THE DRAWINGS

For a more complete understanding of the present invention, and the advantages thereof, reference is now made to the following descriptions taken in conjunction with the accompanying drawings, in which:

FIGS. 7A-7F illustrate various shapes of notches in accordance with embodiments;

FIGS. 8A-8F illustrate various shapes of recesses in accordance with embodiments.

DETAILED DESCRIPTION OF ILLUSTRATIVE EMBODIMENTS

The making and using of the presently preferred illustrative embodiments are discussed in detail below. It should be appreciated, however, that the present invention provides many applicable inventive concepts that can be embodied in a wide variety of specific contexts. The specific illustrative embodiments discussed are merely illustrative of specific ways to make and use the invention, and do not limit the scope of the invention.

Embodiments of the present invention provide several improved methods for the formation of semiconductor devices and the resulting structures. These embodiments are discussed below in the context of forming finFET transistors having a single fin or multiple fins on a bulk silicon substrate. One of ordinary skill in the art will realize that embodiments of the present invention may be used with other configurations, such as, for example, omega-FETs or structures having two or more fins.

Figure 1A:
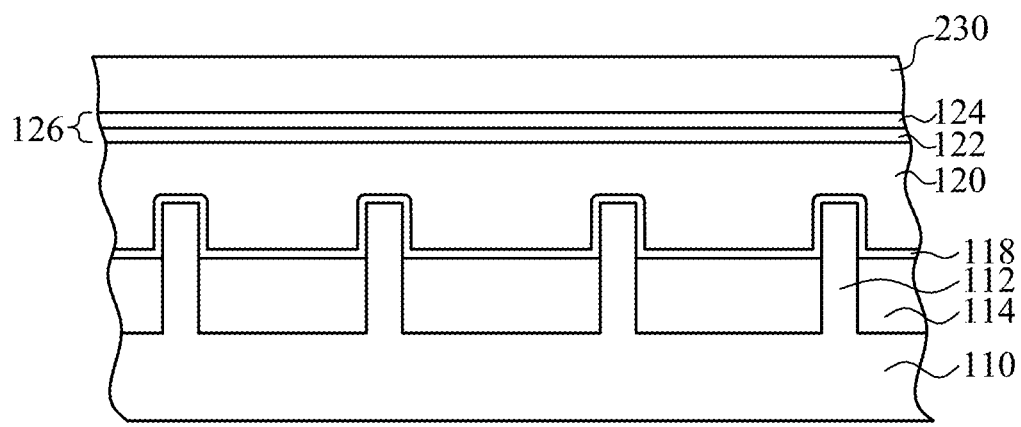
FIGS. 1A-1C, 2A-2C, 3A-3C, 4A-4C, and 5A-5C illustrate various views during various processing steps of forming a finFET in accordance with another embodiment of the present invention.

FIGS. 1A-5C illustrate a method of forming a finFET device in accordance with an embodiment of the present invention. Referring first to FIGS. 1A-1C, FIG. 1C represents a top view of a wafer comprising a substrate 110, fins 112, a dielectric layer 114, and a first mask layer 126. As shown in FIGS. 1A and 1B, wherein FIG. 1A is a cross-sectional view taken along the A-A line of FIG. 1C and FIG. 1B is a cross-sectional view taken along the B-B line of FIG. 1C, the first mask layer 126 is formed over a gate insulator layer 118 and a gate electrode layer 120. The structure illustrated in FIGS. 1A-1C is provided for illustrative purposes only and may be formed by any suitable method for forming a finFET.

Generally, the substrate 110 may be any semiconductor material and may comprise known structures including a graded layer or a buried oxide, for example. In an embodiment, the substrate 110 comprises bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

The fins 112 may be formed, for example, by patterning and etching the substrate 110 by using photolithography techniques. Generally, a layer of photoresist material is deposited over the substrate 110. The layer of photoresist material is irradiated (exposed) in accordance with a desired pattern (the fins 112 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In other embodiments, the fins 112 may be epitaxially grown. For example, exposed portions of an underlying material, such as an exposed portion of the substrate 110, may be used in an epitaxial process to form the fins 112. A mask may be used to control the shape of the fins 112 during the epitaxial growth process.

The dielectric layer 114, which acts as a shallow trench isolation (STI) around the fins 112, may be formed by chemical vapor deposition (CVD) techniques using tetra-ethyl-ortho-silicate (TEOS) and oxygen as a precursor. In another embodiment, the dielectric layer 114 may be formed by implanting ions, such as oxygen, nitrogen, carbon, or the like, into the silicon substrate 110. In yet another embodiment, the dielectric layer 114 is the insulator layer of a SOI wafer.

The gate insulator layer 118, which prevents electron depletion, may be, for example, an oxide layer formed by any oxidation process, such as wet or dry thermal oxidation in an ambient comprising $O_2$, $H_2O$, NO, or a combination thereof, an in-situ steam generation (ISSG) process in an ambient environment of $O_2$, $H_2O$, NO, a combination thereof, or the like. Other materials including, high k dielectric materials, such as: $HfO_2$, $HfSiO_2$, ZnO, $ZrO_2$, $Ta_2O_5$, $Al_2O_3$ and the like, and other processes, such as Atomic Layer Deposition (ALD), Atomic Vapor Deposition (AVD), and the like, may also be used.

The gate electrode layer 120 preferably comprises a semiconductor material such as polysilicon, amorphous silicon, or the like that has been deposited over the fins 112 as illustrated in FIG. 1A. The gate electrode layer 120 may be deposited doped or undoped. For example, in an embodiment the gate electrode layer 120 comprises polysilicon deposited undoped by low-pressure chemical vapor deposition (LPCVD). Once applied, the polysilicon may be doped with, for example, phosphorous ions (or other P-type dopants) to form a PMOS device or boron (or other N-type dopants) to form an NMOS device. The polysilicon may also be deposited, for example, by furnace deposition of an in-situ doped polysilicon. Alternatively, the gate electrode layer 120 may comprise a polysilicon metal alloy or a metal gate comprising metals such as tungsten, nickel, aluminum, tantalum, and titanium, for example.

Figure 1B:
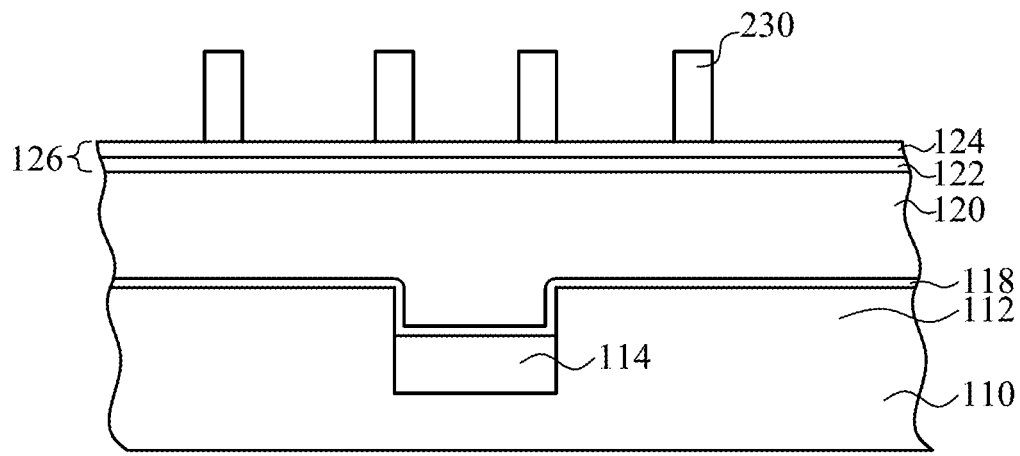

The first mask layer 126 is a protective layer that will be subsequently patterned to prevent the underlying structures (e.g., the gate electrode layer 120) from being removed during subsequent processes, such as etching or implanting steps. One such suitable first mask layer 126 comprises an oxide mask layer 122 and a nitride mask layer 124 as illustrated in FIGS. 1A-1B. The oxide mask layer 122 may be a silicon oxide layer formed by CVD techniques using TEOS and oxygen as a precursor. The nitride layer may be a silicon nitride formed using CVD techniques using silane and ammonia as precursor gases, and deposition temperatures ranging from 550° to 900° C. The nitride layer may comprise other nitrogen containing layers, such as silicon oxynitride $SiO_xN_y$, silicon oxime $SiO_xN_y:H_z$, or a combination thereof.

One of ordinary skill in the art will appreciate that other mask materials and/or structures may be used to form the first mask layer 126. For example, other materials, a single layer, three or more layers, or the like may be used.

Figure 1C:
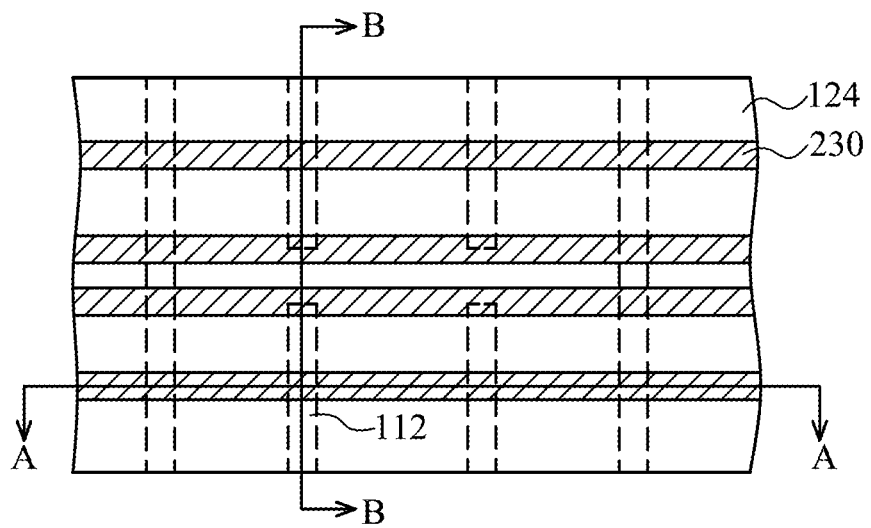

FIGS. 1A-1C further illustrate a first patterned mask 230 formed over the first mask layer 126 and patterned to define gate electrode lines. In an embodiment, the first patterned mask 230 is a photoresist mask formed by depositing, exposing, and developing a layer of photoresist material. The patterned mask 230 is patterned to form gate electrode lines in subsequent processing steps as discussed in greater detail below.

Figure 2A:
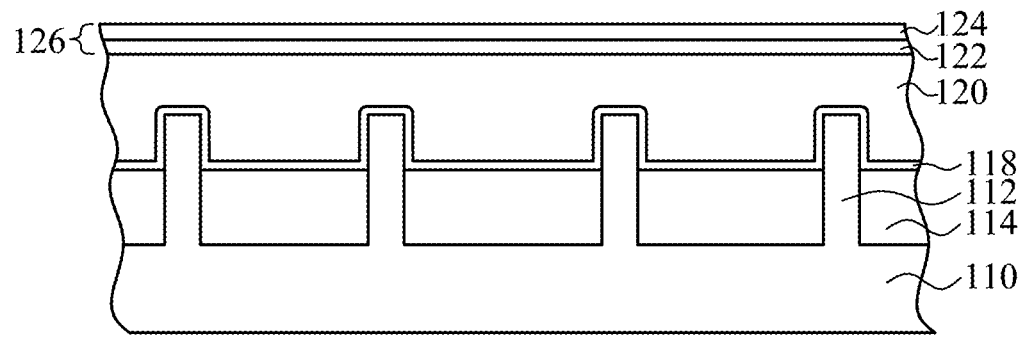
Figure 2B:
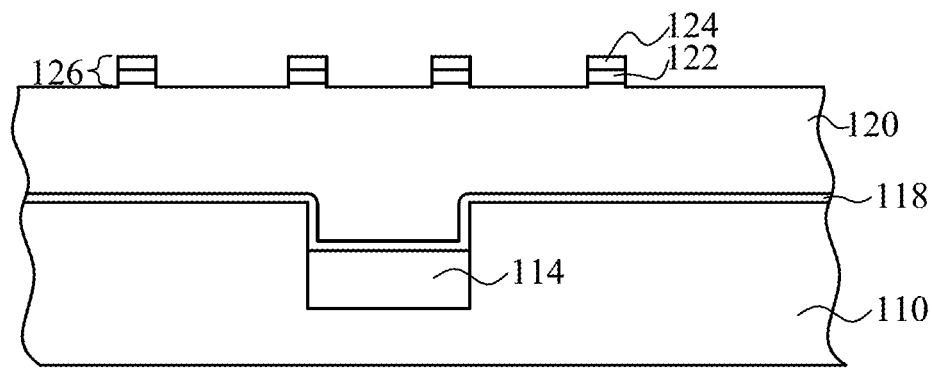
Figure 2C:
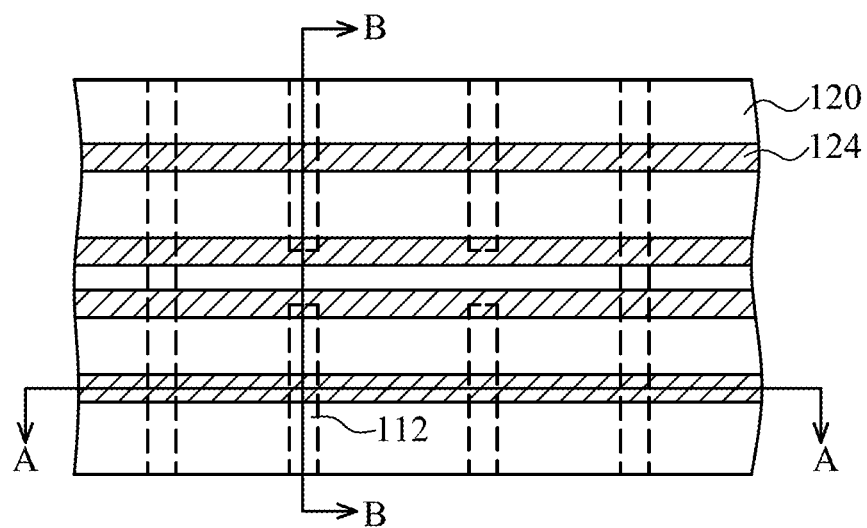

Referring now to FIGS. 2A-2C, wherein FIGS. 2A and 2B are cross-sectional views along the A-A and B-B lines, respectively, of FIG. 2C, there is illustrated patterning of the first mask layer 126 to define gate electrode lines in accordance with an embodiment. In an embodiment in which the first mask layer 126 comprises the nitride mask layer 124 and the oxide mask layer 122, the first mask layer 126 may be patterned using, for example, a wet dip in phosphoric acid ($H_3PO_4$), hydrofluoric acid, and/or the like.

It should be noted that the first patterned mask 230, e.g., the photoresist mask, is not shown in FIGS. 2A-2C for illustrative purposes. The photoresist mask, or portions thereof, may remain. The hardmask, such as the first mask layer 126, provides additional protection for the underlying regions during the etch process. As shown in FIG. 2B, the etching during the patterning of the first mask layer 126 may result in the gate electrode layer 120 being slightly over-etch.

As explained in greater detail below, the gate electrodes are defined using two patterning steps. The first patterning step discussed above forms continuous gate lines. A second patterning step discussed below with reference to FIGS. 3A-4C performs a cutting process in which the gate lines defined above are "cut," thereby defining the ends of the gate lines.

Figure 3A:
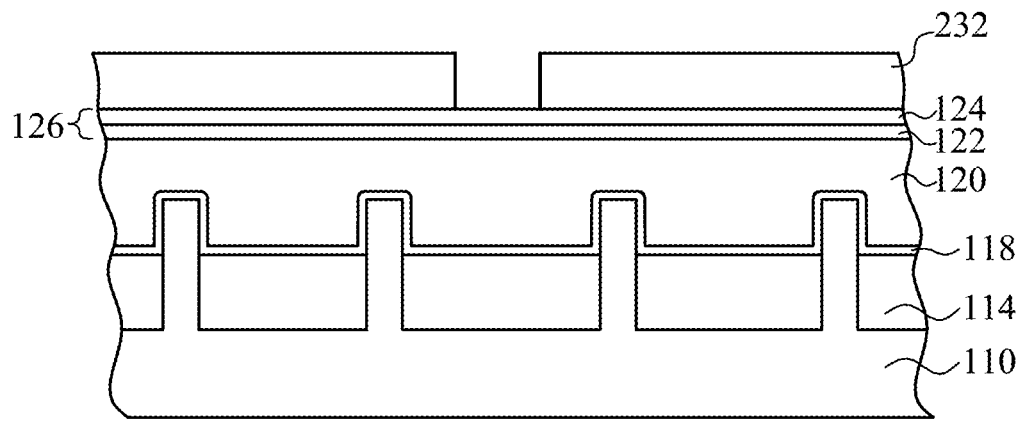
Figure 3B:
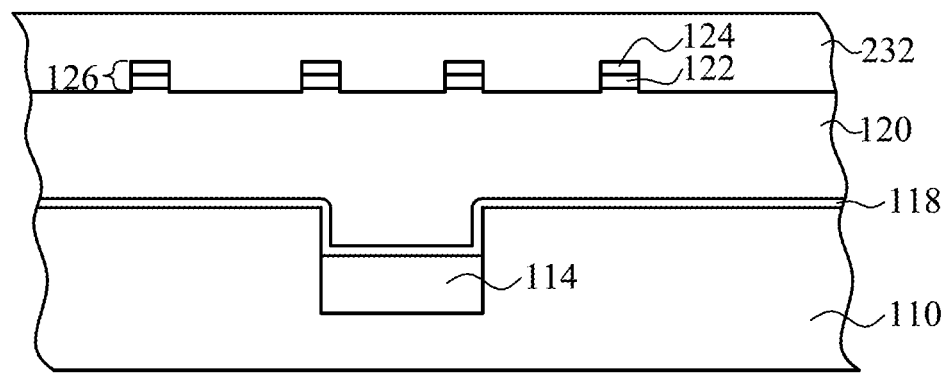
Figure 3C:
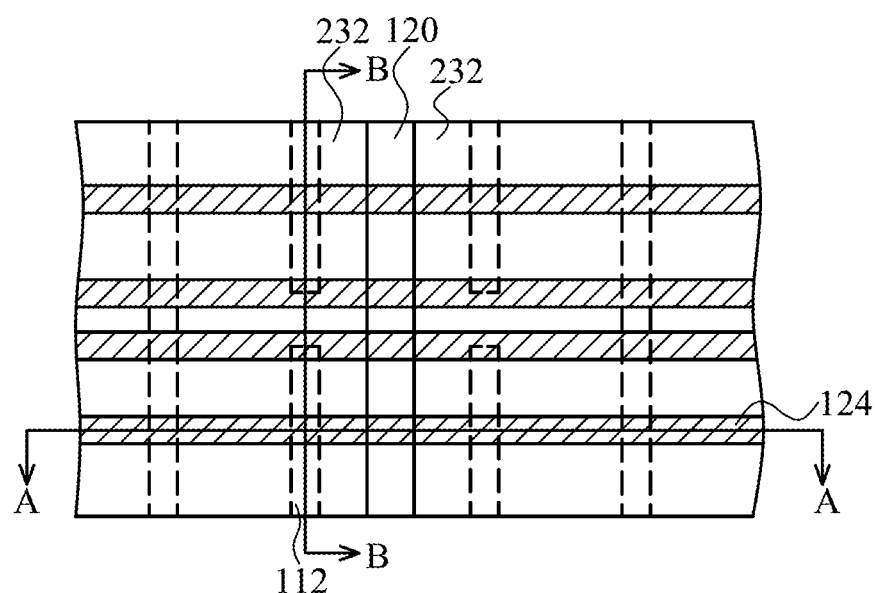

FIGS. 3A-3C, wherein FIGS. 3A and 3B are cross-sectional views along the A-A and B-B lines, respectively, of FIG. 3C, illustrate a second patterned mask 232 formed over the first mask layer 126 and patterned to define the gate electrode ends. In an embodiment, the second patterned mask 232 is a photoresist mask formed by depositing, exposing, and developing a layer of photoresist material. The second patterned mask 232 is patterned to define the gate electrode ends in the first mask layer 126 as discussed in greater detail below.

As illustrated in FIG. 3C, the second patterned mask 232 is patterned to form an opening in the shape of a line extending over multiple lines of the first mask layer 126. In other embodiments, the patterned formed by the second patterned mask 232 may be one or more openings, each opening extending over one or more of the lines formed by the first mask layer 126. For example, in embodiments, each of the lines formed by the first mask layer 126 has a circular, rectangular, or other shaped opening formed in the second patterned mask 232, thereby defining the line ends.

Figure 4A:
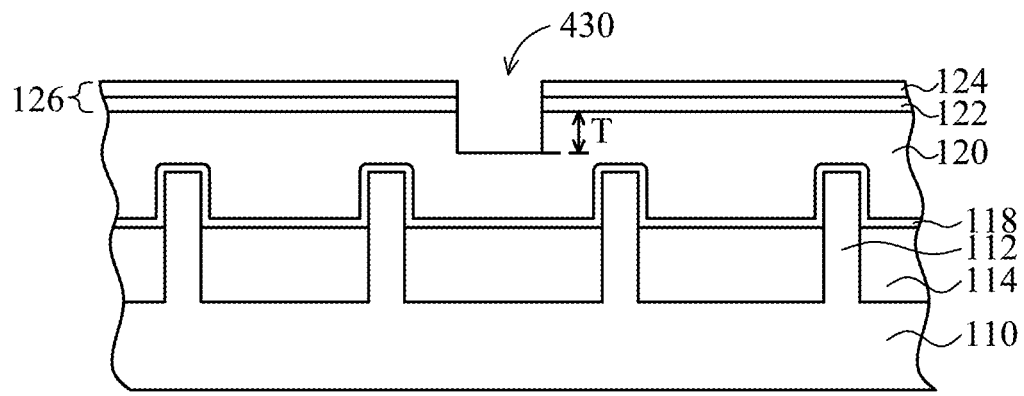
Figure 4B:
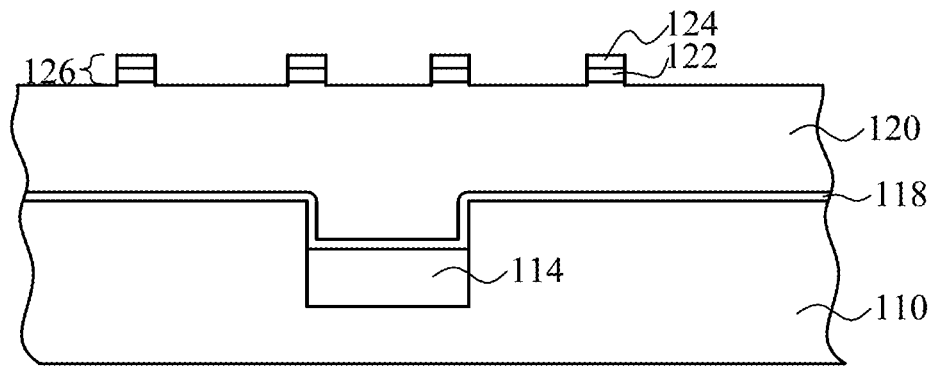
Figure 4C:
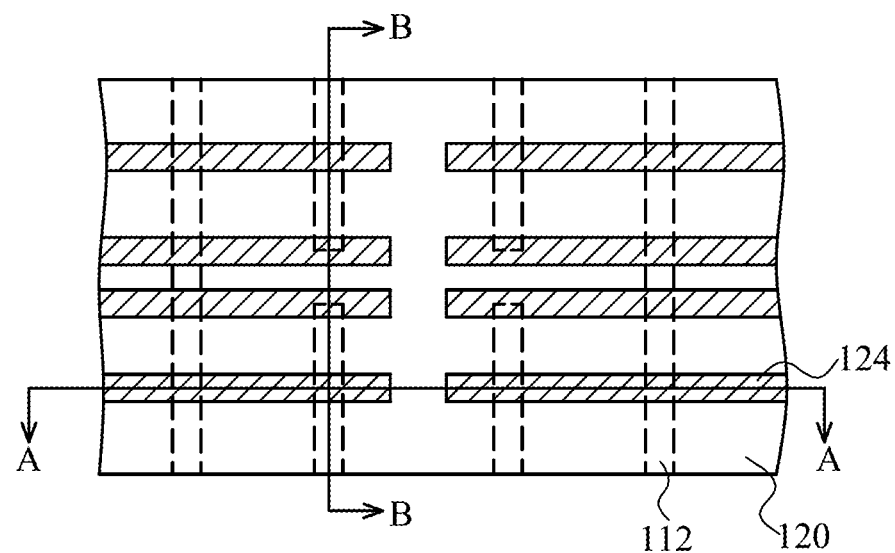

FIGS. 4A-4C, wherein FIGS. 4A and 4B are cross-sectional views along the A-A and B-B lines, respectively, of FIG. 4C, illustrate a second patterning step of the first mask layer 126 to define the gate ends. In an embodiment in which the first mask layer 126 comprises the nitride mask layer 124 and the oxide mask layer 122, the first mask layer 126 may be patterned using, for example, a wet dip in phosphoric acid ($H_3PO_4$), hydrofluoric acid, and/or the like. It should be noted that the order of patterning to form the gate electrode lines followed by patterning to cut the lines was provided for illustrative purposes. Other embodiments may utilize a different order. For example, in other embodiments, the patterning may be reversed such that the ends of the gate electrode are patterned first followed by the patterning to form the gate electrode lines.

As described above, the first mask layer 126 was patterned using two patterning processes. The first patterning process described above with reference to FIGS. 1 and 2 patterned the first mask layer 126 to define the gate electrode lines, and the second patterning process described above with reference to FIGS. 3 and 4 cut the gate electrode line pattern of the first mask layer 126 to form the gate ends.

As illustrated in FIG. 4A, an over-etch may be performed during the patterning of the gate line ends. In an embodiment, the over-etch results in recesses 430 being formed in the gate electrode layer 120. In an embodiment a depth T of the gate electrode layer 120 is from about 0 Å to about 2,000 Å. The recess 430 formed during the etching of the gate ends is greater than any recess that may be formed during etch to form the gate lines (see FIGS. 1 and 2). This recess 430 in the gate end region will aid in the formation of notches in the gate ends in subsequent processing steps and discussed below.

It should be noted that the second patterned mask 232, e.g., the photoresist mask, is not shown in FIGS. 4A-4C for illustrative purposes. The hardmask, such as the first mask layer 126, provides additional protection for the underlying regions during the etch process. The second patterned mask 232 may be removed after patterning the first mask layer 126.

Figure 5A:
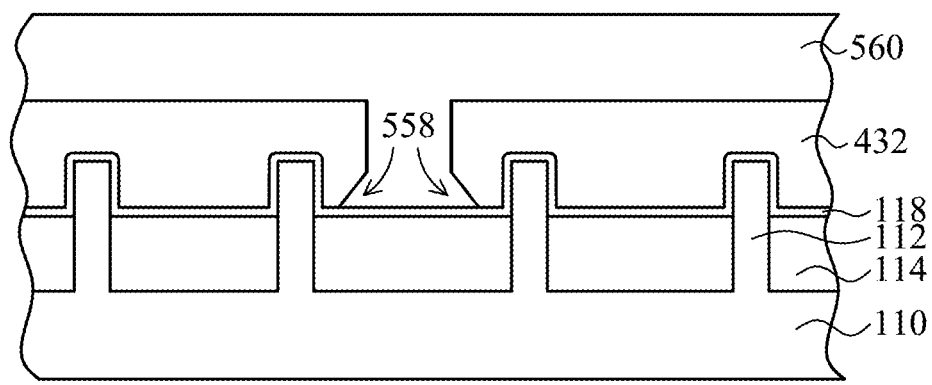
Figure 5B:
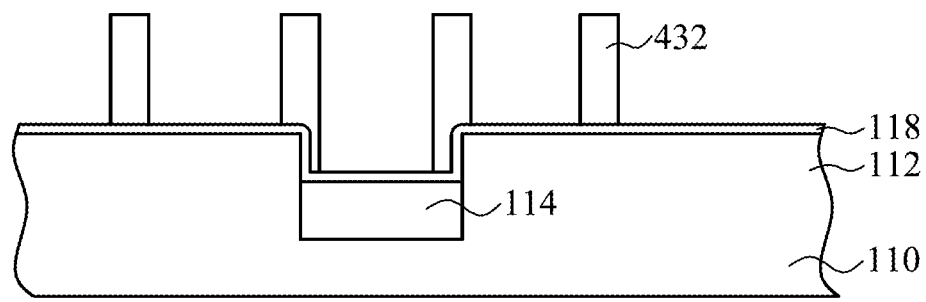
Figure 5C:
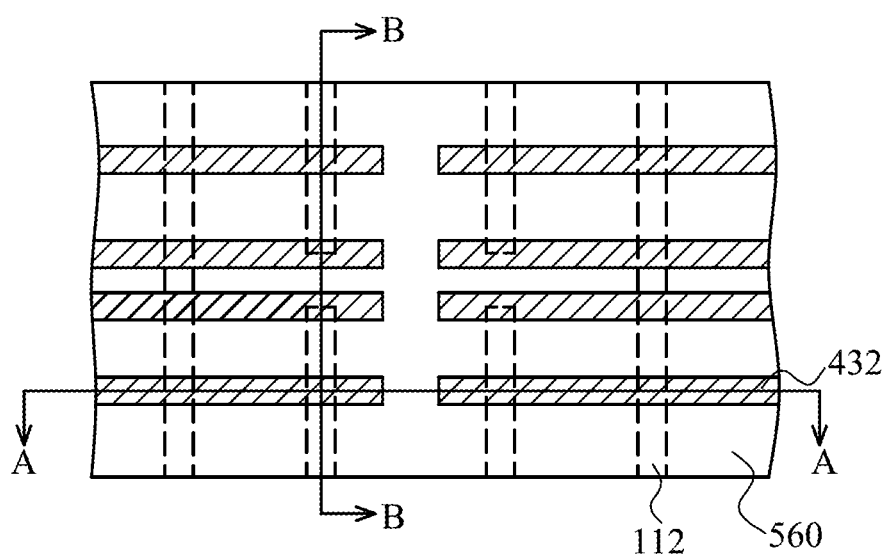

Referring now to FIGS. 5A-5C, wherein FIGS. 5A and 5B are cross-sectional views along the A-A and B-B lines, respectively, of FIG. 5C, there is illustrated results of a second etch process to complete etching of gate electrode layer 120 and forming notches 558 in the gate electrode line ends, thereby forming gate electrodes 432 in accordance with an embodiment. The gate electrode layer 120 is patterned using the patterned first mask layer 120 (see FIGS. 4A-4C) as an etch mask. As illustrated in FIG. 5B, the profile of sides of the gate electrode 432 are relatively linear (within process variations). In contrast, in an embodiment the recesses 430 (see FIG. 4A) formed in the gate electrode layer 120 (see FIG. 4A) allows formation of notches 558 in the ends of the gate electrode 432 as illustrated in FIG. 5A. Such an arrangement as that illustrated in FIGS. 5A-5C provide for better control. For example, the spacing between adjacent gate ends, illustrated in FIG. 5C as distance S1, may be decreased and controlled while reducing the risk of bridging between the gate ends and gate leakage.

FIGS. 5A and 5B further illustrate an inter-layer dielectric (ILD) 560 formed over the gate electrodes 432 and in the notches 558. In an embodiment, the ILD 560 is formed of an oxide such as phospho-silicate glass (PSG), boro-silicate glass (BSG), boron-doped phospho-silicate glass (BPSG), TEOS, or the like.

Figure 6:
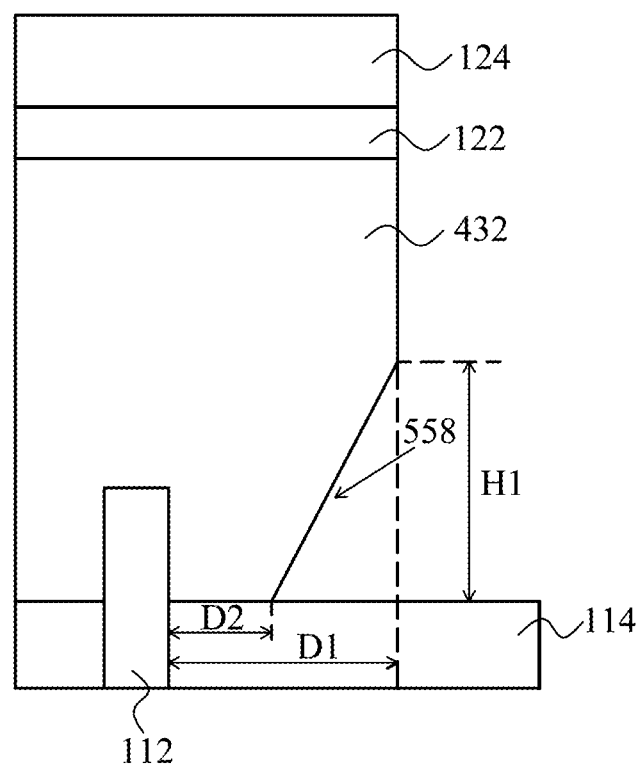
FIG. 6 illustrates an enlarged view of a notch formed in a gate electrode in accordance with an embodiment.

FIG. 6 is an enlarged view of the indented region or notch at the end of the gate electrode 432 illustrated in FIG. 5A. Note that FIG. 6 illustrates that FIG. 6 illustrates the mask 126 remaining on the gate electrode 432. The mask 126 may optionally be removed, as illustrated in FIG. 5A, prior to forming the ILD 560. The notch 558 exhibits a height H1, which in an embodiment is greater than zero and less than 2,000 nm. In this embodiment, gate electrode 432 extends past the fin 112 a first distance D1, and the notch 558 is offset from the fin 112 a second distance D2. In this configuration, a ratio of D1:D2 is greater than 1. The second distance D2 may be greater than zero and less than the first distance, thereby providing contact to the fin 112, yet providing a notch to reduce bridging. A configuration such as this provides a larger distance of gate electrode line end to gate electrode line end, thereby increasing the process window and reducing leakage. Additionally, configurations such as these may also provide a larger process window for high-k metal gate gap filling. The notch areas further provide a smaller distance between the line ends while still maintaining sufficient backfilling with a dielectric material as discussed in greater detail below.

FIGS. 7A-7F illustrate various shapes that may be used to form the notch 558. Generally, the desired shape of the notch 558 may be obtained by varying the process conditions, such as the type of process gas, the concentration of the process gas, temperature, pressure, and the like.

Referring first to FIG. 7A, a triangular-shaped notch is formed. In an embodiment, the triangular-shaped notch 558 is formed using a dry etch process using a process gas such as $CHF_3$, $CF_4$, $CH_2F_2$, $SF_6$, $O_2$, or the like, and a carrying gas such as He, Ar, or the like. The dry etch process may be performed at a temperature from about 25° C. to about 80° C. and at a pressure from about 1 mtorr to about 20 mtorr.

FIG. 7B illustrates an embodiment in which an elliptical-shaped notch is formed. In an embodiment, the elliptical-shaped notch 558 is formed using a dry etch process using a process gas such as $CHF_3$, $CF_4$, $CH_2F_2$, $SF_6$, $O_2$, or the like, and a carrying gas such as He, Ar, or the like. The dry etch process may be performed at a temperature from about 25° C. to about 80° C. and at a pressure from about 3 mtorr to about 20 mtorr.

FIG. 7C illustrates an embodiment in which a square-shaped notch is formed. In an embodiment, the square-shaped notch 558 is formed using a dry etch process using a process gas such as $CHF_3$, $CF_4$, $CH_2F_2$, $SF_6$, $O_2$, or the like, and a carrying gas such as He, Ar, or the like. The dry etch process may be performed at a temperature from about 25° C. to about 80° C. and at a pressure from about 1 mtorr to about 20 mtorr.

FIG. 7D illustrates an embodiment in which a round-shaped notch is formed. In an embodiment, the round-shaped notch 558 is formed using a dry etch process using a process gas such as $CHF_3$, $CH_2F_2$, $SF_6$, $O_2$, or the like, and a carrying gas such as He, Ar, or the like. The dry etch process may be performed at a temperature from about 25° C. to about 80° C. and at a pressure from about 1 mtorr to about 10 mtorr.

FIG. 7E illustrates an embodiment in which a rough or ladder-shaped notch is formed. In an embodiment, the rough or ladder-shaped notch 558 is formed using a dry etch process using a process gas such as $CF_4$, $CH_2F_2$, $SF_6$, or the like, and a carrying gas such as He, Ar, or the like. The dry etch process may be performed at a temperature from about 40° C. to about 80° C. and at a pressure from about 1 mtorr to about 10 mtorr.

FIG. 7F illustrates an embodiment in which a cloud or smooth-shaped notch is formed. In an embodiment, the cloud or smooth-shaped notch 558 is formed using a dry etch process using a process gas such as $CF_4$, $SF_6$, or the like, and a carrying gas such as He, Ar, or the like. The dry etch process may be performed at a temperature from about 40° C. to about 80° C. and at a pressure from about 1 mtorr to about 10 mtorr.

FIGS. 8A-8F illustrate various shapes that may be used to form a recess in the underlying dielectric layer 114 in optional embodiments. It is believed that in some embodiments the notch 558 illustrated above may exhibit gap filling issues when attempting to fill the notch 558 with a dielectric material, such as the ILD layer 560 (see FIG. 5A). In these embodiments, it may be desirable to form a recess in the dielectric layer 114 between the ends of the gate electrode 432. FIGS. 8A-8F illustrates various shapes that may be used to form a recess 832 in the dielectric layer 114. In an embodiment, the recess 832 has a depth from about 0 Å to about 1,000 Å.

It should be noted that FIGS. 8A-8F illustrate the notch 558 as a triangular-shaped notch, but that other shapes of notches may be used, such as those discussed above with reference to FIGS. 7A-7F.

In an embodiment, the recess 832 in the dielectric layer 114 is limited to the area of the notches and the region near the gate electrode line ends. In this embodiment, one or more masks (not shown), such as a photoresist mask, may be used to protect other areas of the dielectric layer 114 while exposing the dielectric layer 114 near the gate electrode line ends.

Referring first to FIG. 8A, there is shown a square-shaped recess formed in the dielectric layer 114. In an embodiment, the square-shaped recess is formed by a dry etch process using a process gas such as $CHF_3$, $CF_4$, $CH_2F_2$, $SF_6$, $O_2$, or the like, and a carrying gas such as He, Ar, or the like. The dry etch process may be performed at a temperature from about 25° C. to about 80° C. and at a pressure from about 1 mtorr to about 20 mtorr.

FIG. 8B illustrates an embodiment in which there is shown an anisotropic bottom rounded-shaped recess formed in the dielectric layer 114. In an embodiment, the bottom rounded-shaped recess is formed by a dry etch process using a process gas such as $CHF_3$, $CF_4$, $SF_6$, $O_2$, or the like, and a carrying gas such as He, Ar, or the like. The dry etch process may be performed at a temperature from about 25° C. to about 80° C. and at a pressure from about 3 mtorr to about 20 mtorr.

FIG. 8C illustrates an embodiment in which there is shown a diamond-shaped recess formed in the dielectric layer 114. In an embodiment, the diamond-shaped recess is formed by a dry etch process using a process gas such as $CHF_3$, $CF_4$, $CH_2F_2$, $O_2$, or the like, and a carrying gas such as He, Ar, or the like. The dry etch process may be performed at a temperature from about 25° C. to about 80° C. and at a pressure from about 3 mtorr to about 20 mtorr.

FIG. 8D illustrates an embodiment in which there is shown a trapezoid or triangular-shaped recess formed in the dielectric layer 114. In an embodiment, the trapezoid or triangular-shaped recess is formed by a dry etch process using a process gas such as $CHF_3$, $CF_4$, $CH_2F_2$, $O_2$, or the like, and a carrying gas such as He, Ar, or the like. The dry etch process may be performed at a temperature from about 25° C. to about 80° C. and at a pressure from about 1 mtorr to about 20 mtorr.

FIG. 8E illustrates an embodiment in which there is shown an anisotripic sidewall rounding-shaped recess formed in the dielectric layer 114. In an embodiment, the sidewall rounding-shaped recess is formed by a dry etch process using a process gas such as $CF_4$, $CH_2F_2$, $SF_6$, $CH_3F$, $O_2$, or the like, and a carrying gas such as He, Ar, or the like. The dry etch process may be performed at a temperature from about 40° C. to about 80° C. and at a pressure from about 1 mtorr to about 10 mtorr.

FIG. 8F illustrates an embodiment in which there is shown an isotropic-shaped recess formed in the dielectric layer 114. In an embodiment, the trapezoid or isotropic-shaped recess is formed by a dry etch process using a process gas such as HF, $NH_3$, $H_2O$, or the like, and a carrying gas such as N or the like. The dry etch process may be performed at a temperature from about 20° C. to about 300° C. and at 1 ATM.

Thereafter, additional processes may be performed to complete the device. For example, the gate electrode may be doped, spacers may be formed, portions of the gate electrode may be silicided, inter-layer dielectric (ILD) layers/and inter-metal dielectric (IMD) layers may be formed, metallization layers may be formed, and the like.

Figure 9:
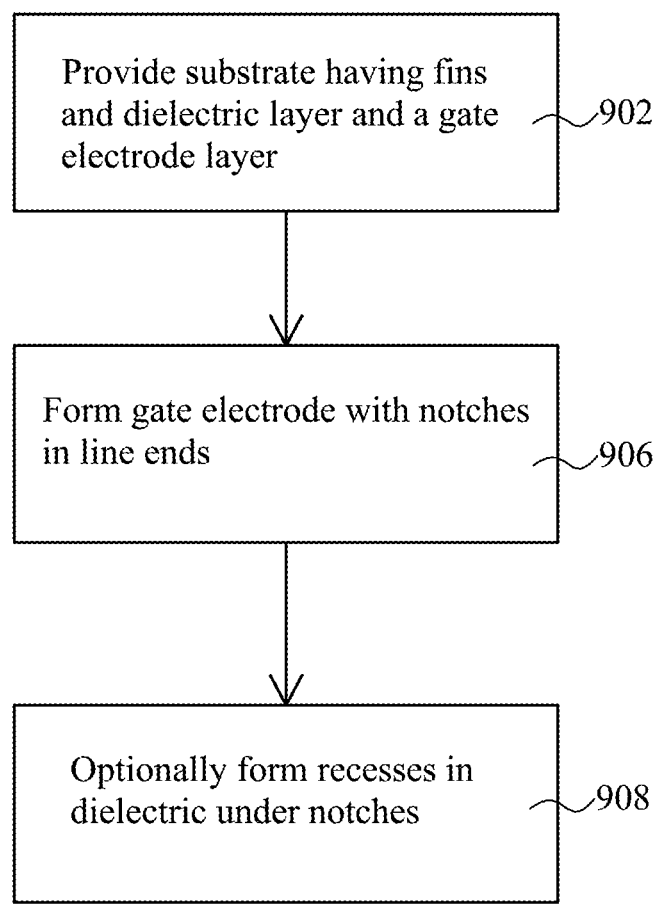
FIG. 9 is a flowchart illustrating a method of forming finFETs in accordance with an embodiment.

FIG. 9 is a flowchart illustrating a method of forming a finFET in accordance with an embodiment. The process begins in step 902 wherein a substrate having fins, a dielectric layer between adjacent fins, and a gate electrode layer over the fins and the dielectric layer is provided, such as that discussed above with reference to FIGS. 1A-1C. In step 906, a gate electrode layer is patterned to form gate electrodes having notches formed in the line ends, such as that discussed above with reference to FIGS. 2A-7F. Optionally, in step 908, recesses are formed in the dielectric layer under the recesses, as discussed above with reference to FIGS. 8A-8F.

In an embodiment, a method of forming a finFET is provided. The method includes providing a substrate having fins extending therefrom and forming a first dielectric layer between adjacent fins, and forming a gate electrode layer over the fins and the dielectric layer. The gate electrode layer is patterned to provide a plurality of gate electrodes, wherein ends of the plurality of gate electrodes have a notch along a bottom edge. The dielectric layer under the notch may be recessed.

In another embodiment, another method of forming a finFET is provided. The method includes providing a substrate having at least two fins aligned laterally, forming a first dielectric layer between ends of the two fins, and forming a first gate electrode over at least a first fin and a second gate electrode over at least a second fin such that the longitudinal axes of the first gate electrode and the second gate electrode being aligned. A first notch is formed in an end of the first gate electrode facing the second gate electrode, and a second notch is formed in an end of the second gate electrode facing the first gate electrode. The dielectric layer under the notches may be recessed.

In yet another embodiment, a finFET is provided. The finFET includes a fin extending away from a substrate and a dielectric layer adjacent the fin. A gate electrode is positioned over the fin and the dielectric layer, wherein an end of the gate electrode has a notch at an interface of the gate electrode and the dielectric layer. The dielectric layer under the notch may be recessed.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular illustrative embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding illustrative embodiments described herein may be utilized according to the present invention. Accordingly, the appended claims are intended to include within their scope such processes, machines, manufacture, compositions of matter, means, methods, or steps.

What is claimed is:

1. A method of forming a fin field-effect transistor (finFET), the method comprising:
providing a substrate having fins extending therefrom;
forming a first dielectric layer between adjacent fins;
forming a gate electrode layer over the fins and the first dielectric layer; and
patterning a plurality of gate electrodes from the gate electrode layer, wherein ends of the plurality of gate electrodes have a notch along a bottom edge, wherein an upper surface of the notch is spaced apart from an upper surface of the first dielectric layer.

2. The method of claim 1, further comprising forming a recess in the first dielectric layer under the notch of the plurality of gate electrodes.

3. The method of claim 2, wherein the forming a recess is performed at least in part using a dry etch with a process gas of $CHF_3$, $CH_3F$, $CF_4$, $CH_2F_2$, $SF_6$, or $O_2$.

4. The method of claim 2, wherein the forming a recess is performed at least in part using a dry etch with a process gas of HF, $NH_3$, or $H_2O$, and a carrier gas of N.

5. The method of claim 1, wherein two of the plurality of gate electrodes are aligned end-to-end, and further comprising forming a recess under the notches of the two gate electrodes.

6. The method of claim 5, further comprising forming a recess in the first dielectric layer between the two gate electrodes recessed such that the recess under the notches of the two gate electrodes form a single continuous recess extending below one notch to the other notch.

7. The method of claim 1, wherein the notch in the plurality of gate electrodes is formed at least in part using a dry etch process.

8. The method of claim 7, wherein the dry etch process utilizes a process gas of $CHF_3$, $CF_4$, $CH_2F_2$, $SF_6$, or $O_2$.

9. A method of forming a fin field-effect transistor (finFET), the method comprising:
providing a substrate having at least two fins aligned laterally;
forming a first dielectric layer between ends of the two fins;

forming a first gate electrode over at least a first fin and a second gate electrode over at least a second fin, longitudinal axes of the first gate electrode and the second gate electrode being aligned;

forming a first notch in an end of the first gate electrode facing the second gate electrode;

forming a second notch in an end of the second gate electrode facing the first gate electrode; and after the forming the first notch, forming a second dielectric layer in the first notch.

10. The method of claim 9, wherein the second dielectric layer extends between the first gate electrode and the second gate electrode.

11. The method of claim 10, wherein the second dielectric layer extends into the second notch.

12. The method of claim 9, further comprising forming a recess in the first dielectric layer.

13. The method of claim 12, wherein the recess extends from under the first notch to under the second notch.

14. The method of claim 9, wherein the recess has a depth less than about 2,000 Å.

15. The method of claim 9, wherein the forming the first notch and the forming the second notch is performed at least in part using a dry etch process.

16. The method of claim 15, wherein the dry etch process utilizes a process gas of CHF3, $CF_4$, $CH_2F_2$, $SF_6$, or $O_2$.

17. A fin field-effect transistor (finFET) comprising:
a fin extending away from a substrate;
a dielectric layer adjacent the fin; and
a gate electrode formed over the fin and the dielectric layer, wherein an end of the gate electrode has a notch above an uppermost surface of the dielectric layer.

18. The finFET of claim 17, wherein a height of the notch is less than 2000 nm.

19. The finFET of claim 17, further comprising a recess in the dielectric layer below the notch.

20. The finFET of claim 19, wherein the recess has a depth less than about 2,000 Å.

\* \* \* \* \*